United States Patent
Dordi et al.

(10) Patent No.: US 7,862,693 B2
(45) Date of Patent: Jan. 4, 2011

(54) APPARATUS FOR PLATING SEMICONDUCTOR WAFERS

(75) Inventors: Yezdi N. Dordi, Palo Alto, CA (US); Fred C. Redeker, Fremont, CA (US); John M. Boyd, Atascadero, CA (US); Robert Maraschin, Cupertino, CA (US); Carl Woods, Aptos, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 12/554,860

(22) Filed: Sep. 4, 2009

(65) Prior Publication Data

US 2009/0321250 A1     Dec. 31, 2009

Related U.S. Application Data

(63) Continuation of application No. 10/882,712, filed on Jun. 30, 2004, now Pat. No. 7,645,364.

(51) Int. Cl.
*C25D 21/12*     (2006.01)
*C25D 19/00*     (2006.01)
*C25B 15/00*     (2006.01)

(52) U.S. Cl. .................. 204/228.1; 204/198; 204/216; 204/229.1; 204/241

(58) Field of Classification Search ............ 204/26, 204/109, 198, 216, 224, 229, 231, 241, 228.1, 204/229.1

See application file for complete search history.

(56) References Cited

U.S. PATENT DOCUMENTS

| | | | | | |
|---|---|---|---|---|---|
| 4,287,044 | A | * | 9/1981 | Biles et al. | 204/228.7 |
| 6,136,163 | A | * | 10/2000 | Cheung et al. | 204/198 |
| 6,398,975 | B1 | * | 6/2002 | Mertens et al. | 216/92 |
| 6,433,541 | B1 | * | 8/2002 | Lehman et al. | 324/230 |
| 6,495,005 | B1 | * | 12/2002 | Colgan et al. | 204/224 R |
| 6,755,954 | B2 | * | 6/2004 | Mayer et al. | 205/96 |

* cited by examiner

*Primary Examiner*—Alexa D Neckel
*Assistant Examiner*—Zulmariam Mendez
(74) *Attorney, Agent, or Firm*—Martine Penilla & Gencarella, LLP

(57) ABSTRACT

An electroplating apparatus for electroplating a surface of a wafer is provided. The wafer is capable of being electrically charged as a cathode. The electroplating apparatus includes a plating head capable of being positioned either over or under the surface of a wafer and capable of being electrically charged as an anode. The plating head is capable of enabling metallic plating between the surface of the wafer and the plating head when the wafer and plating head are charged. The plating head further comprises a voltage sensor pair capable of sensing a voltage present between the plating head and the surface of the wafer, and a controller capable of receiving data from the voltage sensor pair. The data received from the voltage sensor pair is used by the controller to maintain a substantially constant voltage to be applied by the anode when the plating head is placed in positions over the surface of the wafer. A method of electroplating a wafer is also provided.

14 Claims, 15 Drawing Sheets

FIG. 3 (Reverse View)

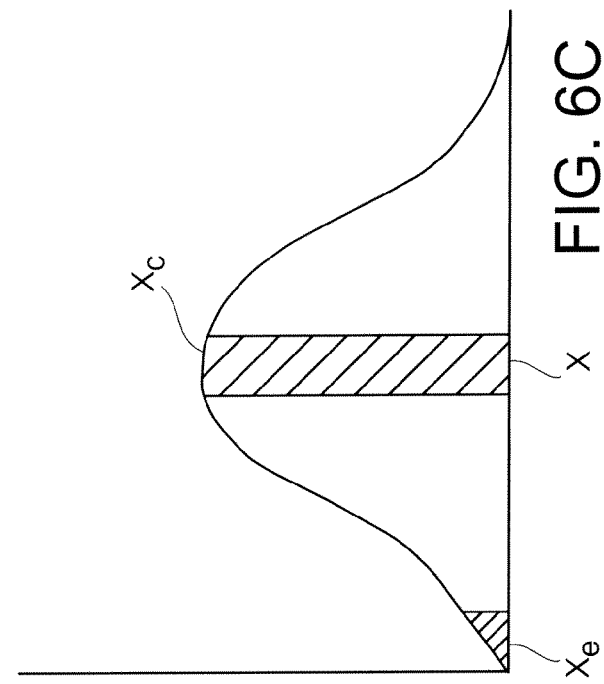
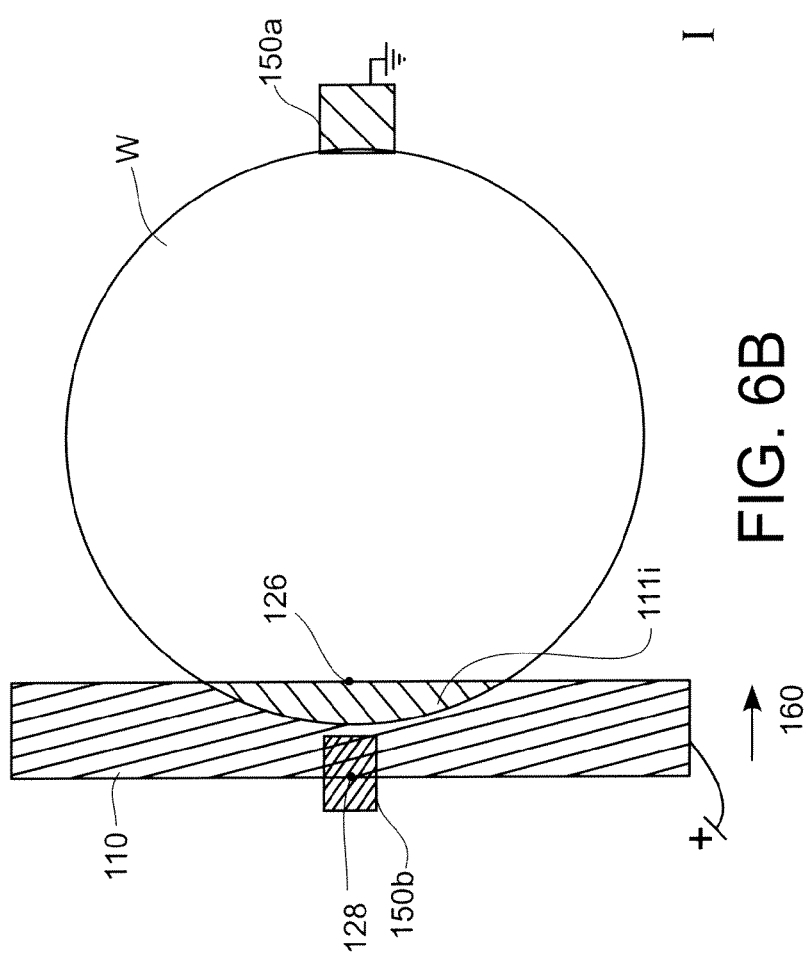

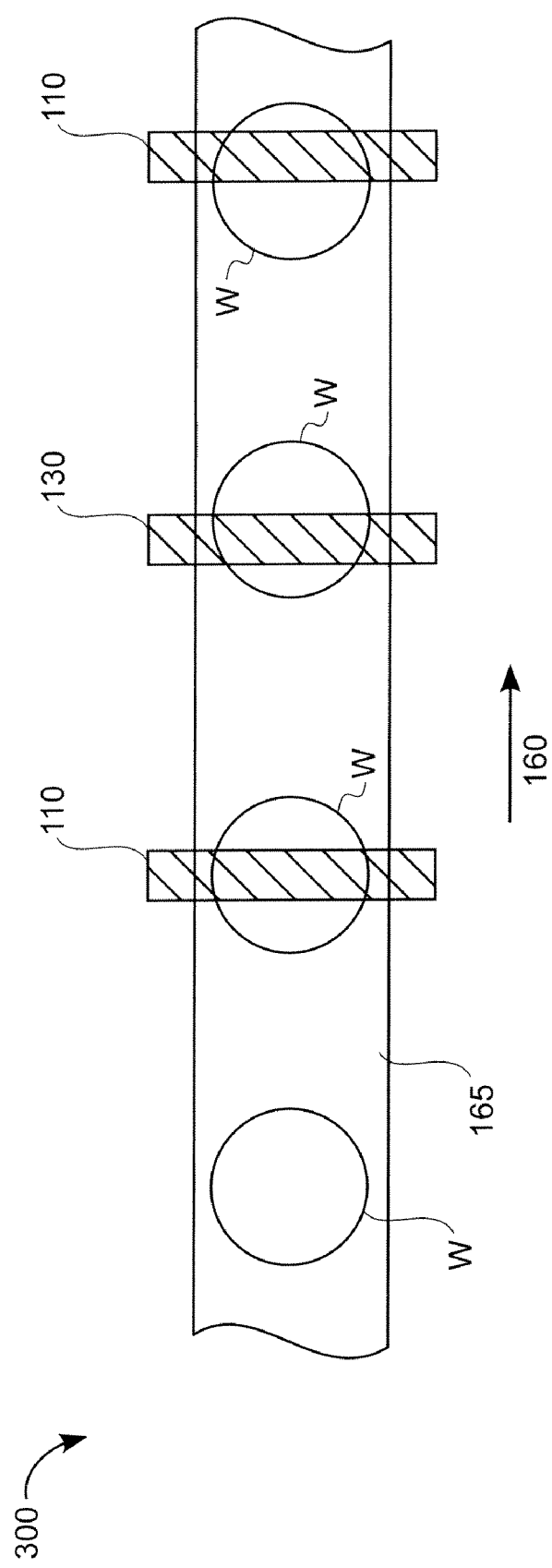

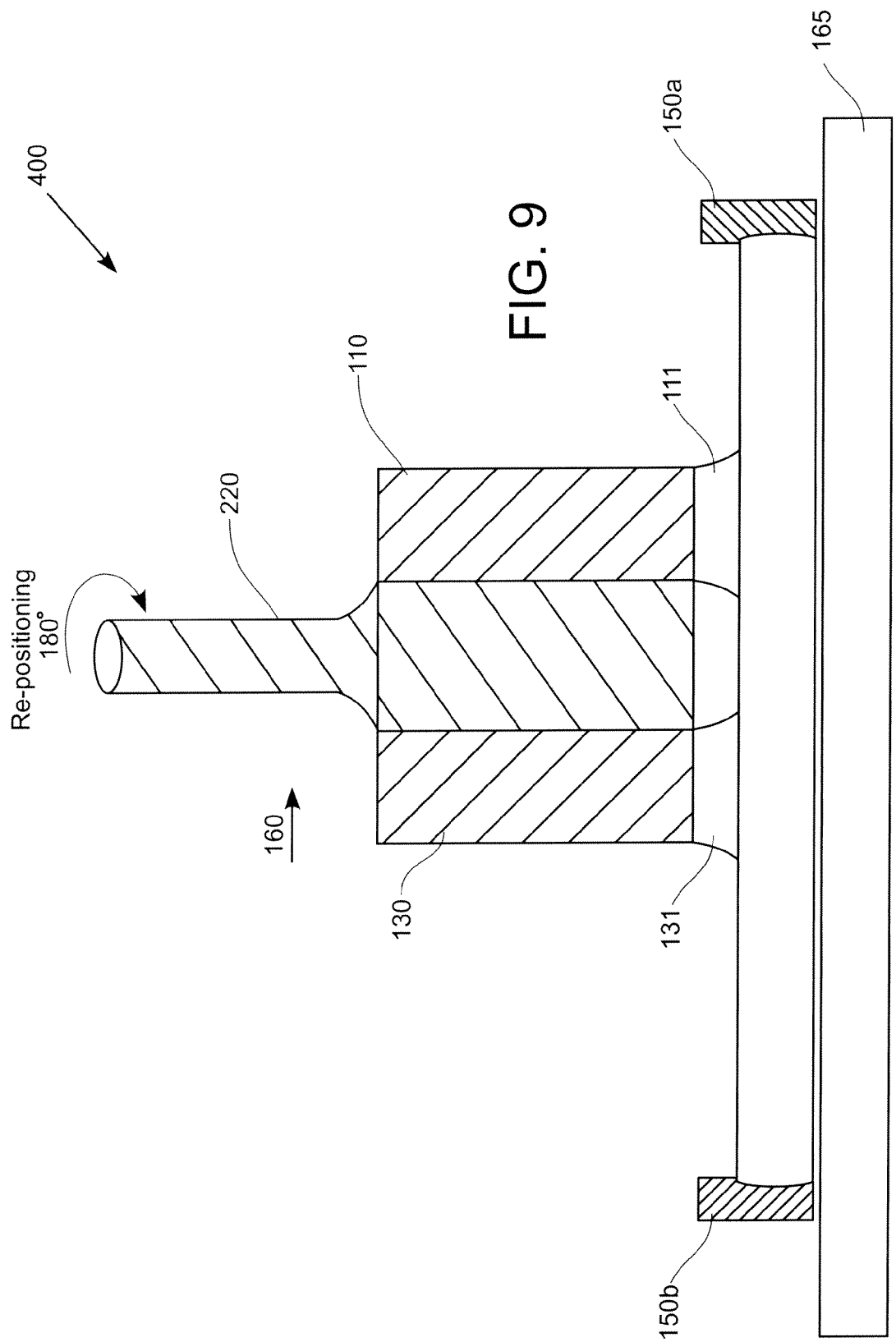

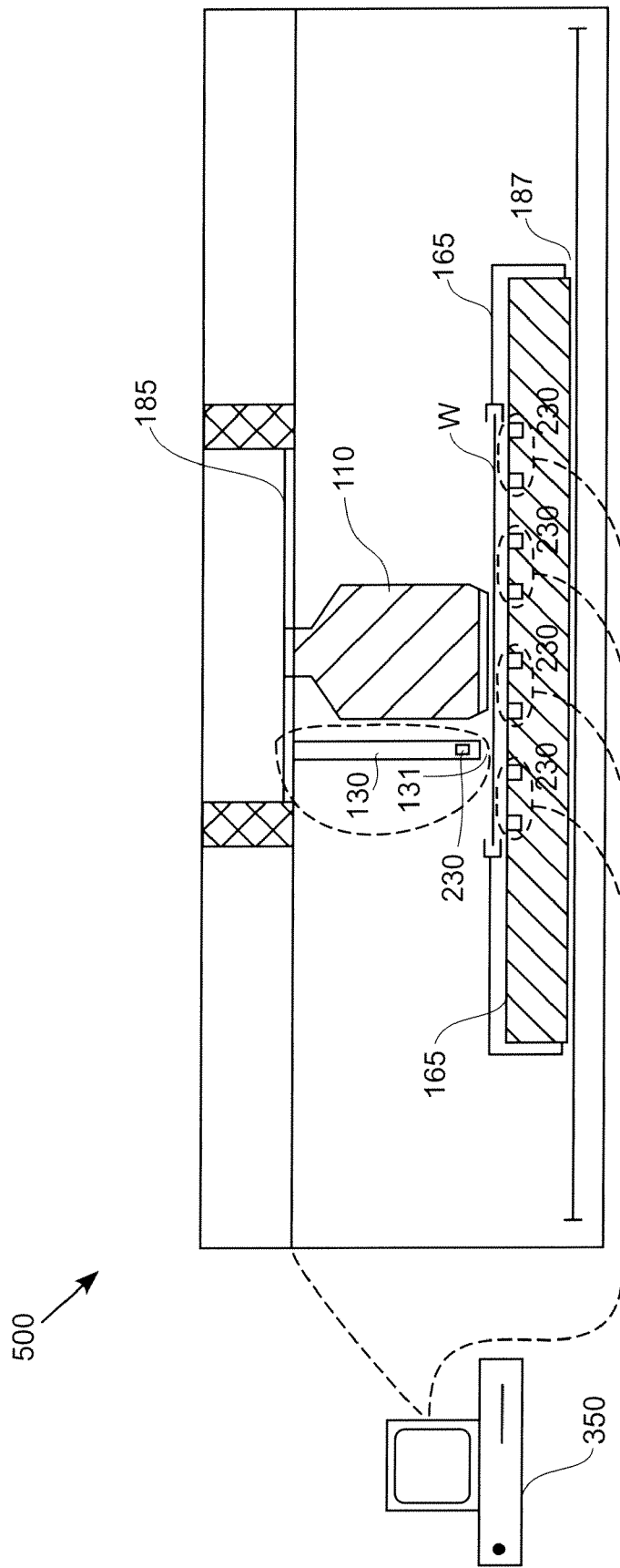

APPARATUS FOR PLATING SEMICONDUCTOR WAFERS

CLAIM OF PRIORITY

This application is a continuation of prior application Ser. No. 10/882,712, filed on Jun. 30, 2004 now U.S. Pat. No. 7,645,364, from which priority under 35 U.S.C. §120 is claimed. The disclosure of this application is incorporated herein by reference.

CROSS REFERENCE TO RELATED APPLICATION

This application is related to U.S. patent application Ser. No. 10/330,843 filed on Dec. 24, 2002 and entitled "Meniscus, Vacuum, IPA Vapor, Drying Manifold," U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces," U.S. patent application Ser. No. 10/186,472, entitled "Integration of Sensor Based Metrology into Semiconductor Processing Tools", and filed on Jun. 28, 2002, U.S. patent application Ser. No. 10/607,611 filed on Jun. 27, 2003 and entitled "Apparatus and Method for Depositing and Planarizing Thin Films of Semiconductor Wafers," and U.S. patent application Ser. No. 10/879,396, filed on Jun. 28, 2004, entitled "Electroplating Head and Method for Operating the Same," all of which are incorporated herein by reference in their entirety.

BACKGROUND OF THE INVENTION

1. Field of the Invention

The present invention relates to semiconductor wafer deposition and planarization and, more particularly, to apparatuses and techniques for more effectively depositing thin films using localized deposition and for enabling localized planarization.

2. Description of the Related Art

Electroplating is a well-established deposition technology. In the semiconductor fabrication arts, electroplating is typically performed in a single-wafer processor, with the wafer immersed in an electrolyte. During electroplating, the wafer is typically held in a wafer holder, at a negative, or ground potential, with respect to a positively charged plate (also immersed in the electrolyte) which acts as an anode. To form a copper layer, for example, the electrolyte is typically between about 0.3M and about 0.85M $CuSO_4$, pH between about 0 and about 2 (adjusted by $H2SO4$), with trace levels (in ppm concentrations) of proprietary organic and/or inorganic additives to enhance the deposited material quality.

During the plating process the wafer is typically rotated to facilitate uniform plating. After a sufficient film thickness has been achieved during the plating process, the wafer is moved from the plating chamber to another chamber where it is rinsed in de-ionized (DI) water to remove residual electrolyte from the wafer surface. Next the wafer is subjected to additional wet processing, to remove unwanted copper from the backside and bevel edge, and then another DI water rinse removes wet processing chemical residues. Then the wafer is dried and annealed before it is ready for chemical mechanical planarization (CMP) operations. Unlike processing wafers in vacuum environments, "wet" operations during wafer processing are followed by an additional DI water rinse and drying step. Due to electrolyte dilution concerns and increased hardware design complexity, DI water rinsing is typically not done within the plating chamber. Today, approximately fifty percent of the wet processing stations on wafer plating tools are dedicated to plating, having a significant negative impact on wafer throughput and increasing processing cost. In addition, in order to enable direct copper plating on a barrier layer, the amount of time between surface activation and plating must be minimized. The effectiveness of the surface activation operation is limited by additional time taken to rinse a wafer after surface activation and to transport the wafer to the plating module. Eliminating or reducing the amount of separate DI water rinses between wet processing steps provides a more efficient methodology.

During a plating process, the wafer acts as a cathode requiring that a power supply be electrically connected to the wafer. Typically, numerous discrete contacts on a wafer holder or support connect the wafer holder electrically to the edge of the wafer. Electrical current provided through these contacts is utilized to electroplate the wafer. In the traditional approach, plating current is evenly distributed around the perimeter of the wafer with the goal of providing uniform deposition. Uniform deposition typically requires uniform and consistent contact resistance with the wafer through a resistive seed layer. Therefore, in an effort to provide uniform deposition, cleanliness and repeatability of the contacts to the substrate is preferred. In some cases, cleaning of the contacts requires additional processes that further limit the productivity of plating operations.

Bipolar effects are another challenge in copper electroplating, and are observed when contact resistance is very high. Bipolar effects occur when wet contacts are used in the plating process. This effect induces etching of the copper seed layer directly under the contacts, thereby severing the electrical contact between the wafer and the power supply during electroplating. Bipolar effects are avoided when dry contacts are used, however dry contact methods require complicated seal design and are prone to reliability problems. As feature dimensions on semiconductor wafers continue to shrink, copper seed layer thickness is also expected to decrease, from approximately 1000 angstroms today to less than about 400 angstroms. Thickness reduction of the seed layer is necessary to ensure a reasonable sized opening at the top of the features so as to enable void free gap fill during the copper electroplating process. Since the role of the seed layer is to distribute the plating current over the entire wafer during electroplating, a thinner more resistive seed layer introduces a significant challenge in chambers designed for uniform plating near contacts on the wafer periphery. Known as the terminal effect, this effect is more pronounced on larger wafers, such as today's 300 mm wafers.

What is needed therefore, is an electroplating system that provides uniform electroplating on barrier layers of semiconductor wafers without bipolar effects.

SUMMARY OF THE INVENTION

Broadly speaking, the present invention is an apparatus that provides localized electroplating using a meniscus based plating process.

It should be appreciated that the present invention can be implemented in numerous ways, including as a process, an apparatus, a system, a device or a method. Several inventive embodiments of the present invention are described below.

In one embodiment, an electroplating apparatus for electroplating a surface of a wafer is provided. The wafer is capable of being electrically charged as a cathode. The electroplating apparatus includes a plating head capable of being positioned over or under the surface of a wafer and capable of being electrically charged as an anode. The plating head is capable of enabling metallic plating between the surface of the wafer and the plating head when the wafer and plating head are charged. The plating head further comprises a voltage sensor pair capable of sensing a voltage present between the plating head and the surface of the wafer, and a controller capable of receiving data from the voltage sensor pair. The data received from the voltage sensor pair is used by the controller to maintain a substantially constant voltage to be applied by the anode when the plating head is placed in positions over the surface of the wafer.

In another embodiment of the present invention, a method for plating a surface of a wafer is provided. The method consists of forming a plating meniscus over the surface of the wafer, the plating meniscus having an applied charge to enable plating of a metallic material, moving the plating meniscus across positions of the wafer surface and controlling the applied charge of the plating meniscus. The applied charge is varied when the plating meniscus is moved across the positions of the wafer surface so that a plating layer is substantially uniform across the wafer surface.

In another embodiment of the present invention, an electroplating apparatus for electroplating a surface of a wafer is provided. A plating head configured to be positioned over the surface of the wafer is capable of being electrically charged as an anode for plating a metallic layer over the surface of the wafer. The plating head is further capable of providing a first fluid between the plating head and the surface of the wafer. A proximity head configured to be placed over the surface of the wafer is capable of following in the path of the plating head and processing the surface of the wafer.

In another embodiment of the present invention, a system for electroplating a surface of a wafer is provided. A plating head is capable of being positioned over the surface of a wafer and capable of being electrically charged as an anode. The plating head is also capable of enabling metallic plating between the surface of the wafer and the plating head when the wafer and plating head are charged. The plating head includes a voltage sensor pair capable of sensing a voltage present between the plating head and the surface of the wafer; and a controller capable of receiving data from the voltage sensor pair. The data is used by the controller to maintain a substantially constant voltage that is to be applied by the anode when the plating head is placed in positions over the surface of the wafer. The system further includes a proximity head capable cleaning and drying of the surface of the wafer, a wafer handling mechanism capable of transferring and holding the wafer in position during processing; and a computer capable of controlling the operation of the electroplating system.

The advantages of the present invention are numerous, most notably; the embodiments enable localized plating, thus reducing the active area of plating and improving chemical exchange. Localized metallic plating reduces the total plating current that must be distributed over a barrier or seed layer, thereby significantly reducing the resistive layer effect and improving deposit uniformity. Constant monitoring and control of voltage applied by the anode provides uniform current density across the surface of a wafer undergoing plating operations. Concurrent pre-treatment, plating, rinsing and drying techniques consolidate processing producing a more efficient methodology. For example, by having pre-clean and plating processes in an adjacent configuration, local processing ambient conditions can be maintained relatively oxygen-free. Inert gas curtains can be used to prevent re-oxidation of the activated surface region formed between the pre-clean and plating process steps. Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

FIG. 6b provides a top view of the plating head in operation as it transitions over an edge of a wafer, in accordance with the present invention.

FIG. 6c is a representative graph of current density as the wafer is positioned beneath a plating head in operation, in accordance with the present invention.

FIG. 8 illustrates an example of a wafer transport apparatus for electroplating operations, in accordance with one embodiment of the present invention.

FIG. 9 provides another embodiment of an electroplating apparatus in accordance with the present invention.

FIG. 10b illustrates another embodiment of an electroplating system, in accordance with the present invention

DETAILED DESCRIPTION OF THE PREFERRED EMBODIMENTS

An invention, for methods and apparatuses for electroplating surfaces of a wafer, is disclosed. The present invention generally provides electrical contact in dry regions of a semiconductor wafer while producing uniform electroplating on barrier. Integrated rinsing processes are provided in an effort to reduce exposure time to electrolyte and consolidate processing. To ensure layer uniformity, the present invention implements single point dry electrical contact with a wafer while maintaining constant voltage, thereby evenly distributing current density across a wafer.

The following description provides further advancements in the field of plating techniques in the semiconductor arts. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

Figure 1:
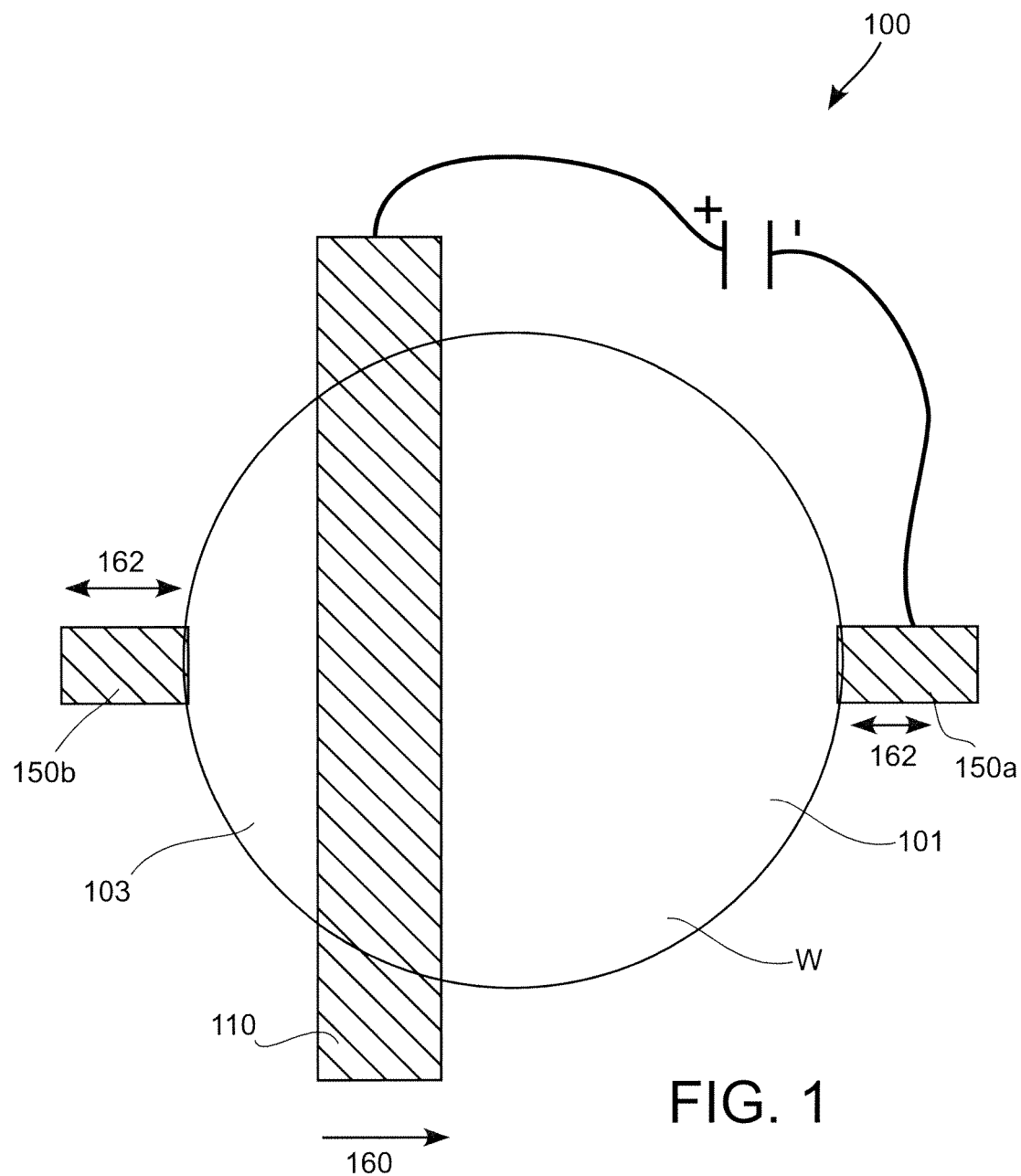
FIG. 1 illustrates one embodiment of an electroplating apparatus, in accordance with the present invention.

FIG. 1 is an illustration of exemplary electroplating apparatus 100 in accordance with one embodiment of the present invention. A wafer W is capable of being electrically connected to an electrical contact at the trailing edge of the wafer 150a and an electrical contact at the front edge of the wafer 150b attached in an edge exclusion region of the wafer W. The electrical contacts 150a and 150b can physically move in a direction 162 in order to be attached to an edge exclusion region of the wafer W or separated from the wafer W. An edge exclusion region exists at the periphery of the wafer and is typically between about 1 mm to about 3 mm, for 200 mm and 300 mm wafers. A power supply negatively charges the wafer W to function as a cathode by way of electrical contacts 150a or 150b.

A plating head 110, is capable of being charged as an anode by a power supply and is capable of being suspended above the wafer W. While not shown, the electroplating apparatus 100 could be inverted so that the wafer W is above the plating head 110. The plating head 110 is not in contact with the surface of the wafer W, however it is capable of being placed in close proximity to the wafer W. The plating head 110 may be configured as a bar that extends across the surface of the wafer W. The plating head 110 may be supported by an arm, an overhead bar, or any suitable device capable of allowing the plating head 110 to be positioned above the surface of the wafer W. The wafer W may have a seed layer. The seed layer is optional, however, some embodiments may benefit from having the seed layer formed thereon before an electroplating operation is performed. When copper is the material being plated, the seed layer is typically a thin layer of copper that may be sputtered or deposited using known techniques.

As the plating head 110 proceeds in a relative direction 160 over the surface of the wafer W towards the electrical contact at the trailing edge of the wafer 150a it leaves a plated layer 103 in its path. The plated layer 103 is formed by way of an electrochemical reaction facilitated by an electrolyte contained in a meniscus. A meniscus is a fluid volume defined between the plating head 110 and the wafer W (discussed in greater detail below). In an alternative embodiment, the plated layer 103 can be formed over a layer that is not a seed layer. An example of such layer may be a barrier layer or some other layer material. The plated layer 103 may be any metal that can be electroplated, such as one of copper, nickel, cobalt, ruthenium, alloys of these listed metals, or composite metallic materials suitable for semiconductor applications.

The plating head 110 can be programmed to scan the wafer W in any number of ways. It should be appreciated that the system is exemplary, and that any other suitable type of configuration that would enable movement of the head(s) into close proximity to the wafer may be utilized. In a preferred embodiment, the plating head 110 may move in a linear fashion from one edge of the wafer W to another diametrically opposite edge of the wafer W. Other non-linear movements may be utilized such as, for example, a radial motion, a circular motion, a spiral motion, or a zigzag motion, etc. For example, if the wafer W and contacts 150a and 150b were rotated, the plating head 110 could start at the center of the wafer W and progressively move linearly to the outer edge.

In another embodiment, the plating head 110 could navigate the wafer W while circling in an orbital fashion or otherwise move over the wafer in a fashion that enables processing of all portions of the wafer. The motion may also be any suitable specified motion profile as desired by a user. During movement, it is desired that the plating operation deliver a uniform layer of metallic material to the surface of the wafer W. Details regarding the operation of the plating head 110 will be described in greater detail below.

As used herein, localized metallic plating is meant to define an area beneath the plating head 110 where a metallic material is deposited. As shown in the drawings (FIG. 1-3, and 5-10), the area beneath the plating head 110 is less than the entire surface area of the wafer W. Thus, localized metallic plating will occur only under the plating head 110 at a given point in time. To accomplish more metallic plating over the surface of the wafer W, the plating head 110 will move over another surface area of the wafer W. In exemplary embodiments, the plating head 110 will be configured in the shape of a bar and is capable of movement ensuring uniform plating over the entire surface of the wafer W. Alternatively, since the movement of the plating head 110 over the wafer W is relative, the wafer W and electrical contacts 150a and 150b can be moved instead of moving the plating head 110.

Figure 2:
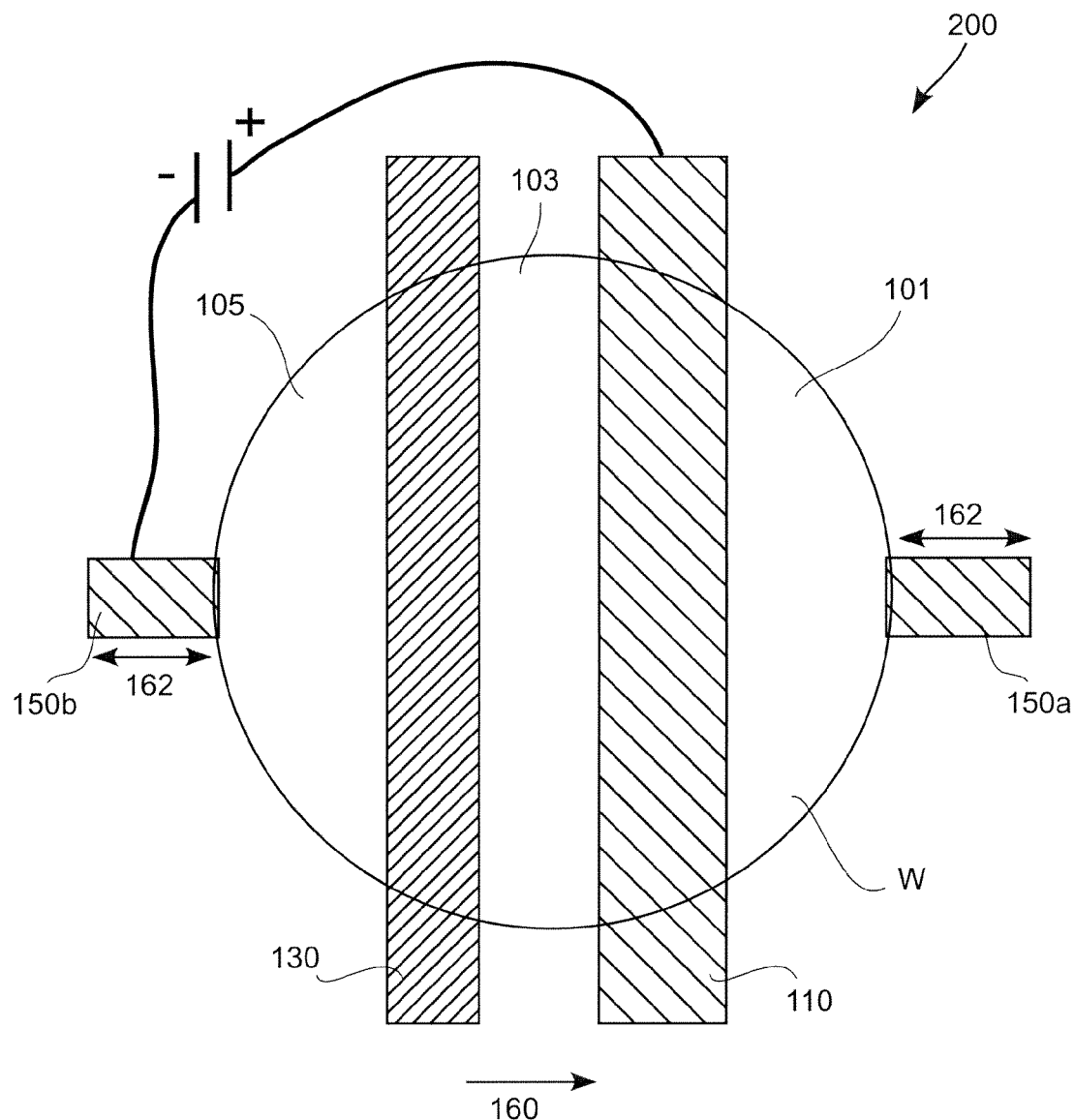
FIG. 2 provides an example of an electroplating apparatus with a cleaning component, in accordance with the present invention.

FIG. 2 provides an embodiment of a plating apparatus that is capable of cleaning, rinsing and drying the wafer W after the plating operation is performed by the plating head 110. During operation, the plating head 110 proceeds in the relative direction 160 towards the edge of the wafer W and an un-plated area of the wafer 101. A plated layer 103 that has not been cleaned is shown as lying between the plating head 110 and a second head known as a proximity head 130. The proximity head 130 has a plurality of inputs capable of providing one or more of de-ionized water, chemicals, diluted chemicals and isopropyl alcohol. A plurality of outputs are also contained in the proximity head 130, the outputs being capable of removing fluids from the surface of the wafer W.

The proximity head 130 is capable of cleaning, rinsing, and drying the region of the wafer W with the plated layer 103, removing any remaining electrolyte from the surface of the wafer W. The dry plated region 105 shown at the edge of the wafer W nearest the electrical contact at the front edge of the wafer 150b has been cleaned by the proximity head 130. In one embodiment, the electrical contact at the front edge of the wafer 150b can be moved in a direction 162 so as to not be in contact with the wafer W during the initial plating operation performed at the front edge of the wafer. In the case of such separation between 150b and the wafer W, the electrical contact at the back edge of the wafer 150a is placed in physical contact with the wafer W providing the current path necessary for the electrochemical reaction.

Figure 3:
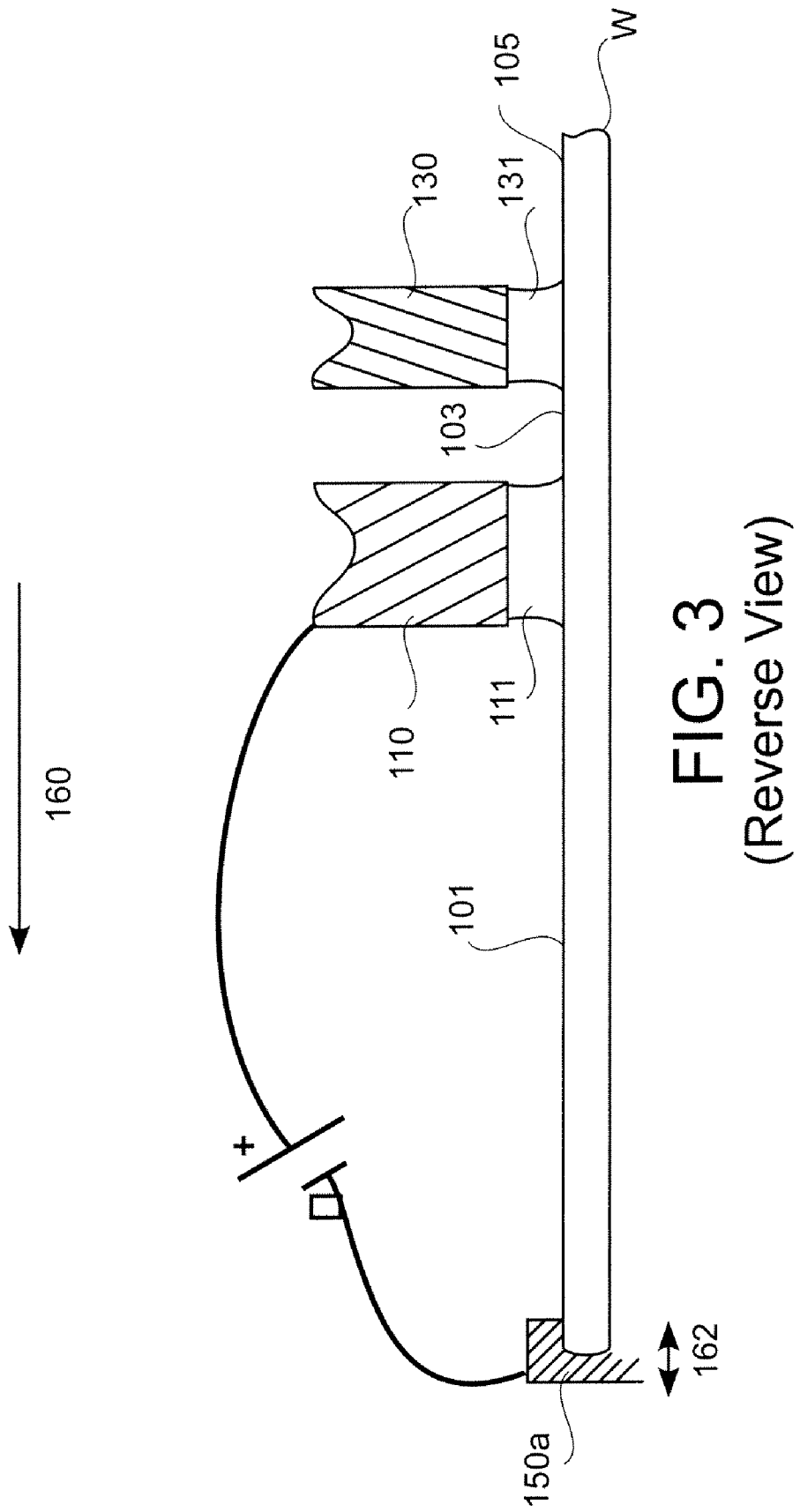
FIG. 3 illustrates the electroplating apparatus during a plating operation, in accordance with the present invention.

FIG. 3 provides an alternative view of the wafer plating apparatus in accordance with the present invention. As discussed in FIGS. 1 and 2 above, the plating head 110 proceeds in a relative direction 160 over the wafer W towards the electrical contact at the trailing edge of the wafer 150a. During operation, a plating meniscus 111 is formed beneath the plating head 110 that is in contact with both the plating head 110 and the wafer W.

A meniscus employs the use of a fluid's surface tension gradient (STG) to maintain an encapsulated area of fluid above or below a surface, or between surfaces. The operation of a meniscus employed by proximity heads is disclosed in co-pending U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces." The plating meniscus 111 contains electrolyte capable of completing the electrical path to the wafer W as well as materials necessary for the plating operation as described in FIGS. 5-7 below. The plating head 110 and the plating meniscus 111 move in a relative direction 160 towards the un-plated area of the wafer 101 leaving a plated yet un-rinsed portion of the wafer 103. In one embodiment, a proximity head 130 that follows behind the plating head 110 has a cleaning meniscus 131 that provides one of de-ionized water (DI-water), isopropyl alcohol (IPA), and vacuum. The proximity head 130 cleans the surface of the wafer containing the plated layer 103 leaving a dry plated region 105. Cleaning performed by the proximity head 130 may include an optional rinse. Use of IPA is optional and not necessary if the vacuum provided by the plurality of outputs is strong enough to remove fluids on the wafer surface and the movement of the proximity head 130 is controlled. The proximity head 130 is capable of operating in the fashion described in U.S. patent application Ser. No. 10/330,843 filed on Dec. 24, 2002 and entitled "Meniscus, Vacuum, IPA Vapor, Drying Manifold" by providing continuous supply and removal of DI-water within an IPA boundary.

In another embodiment of the present invention, portions of the plating head 110 may incorporate the features of the proximity head 130, thereby removing the need for a separate head or bar to be used to clean the surface of the wafer W containing the plated layer 103. The proximity head 130 discussed in FIG. 2 and FIG. 3 above may also be attached to the plating head 110 in any suitable fashion so that efficient rinsing and drying of the wafer W is provided.

Figure 4:
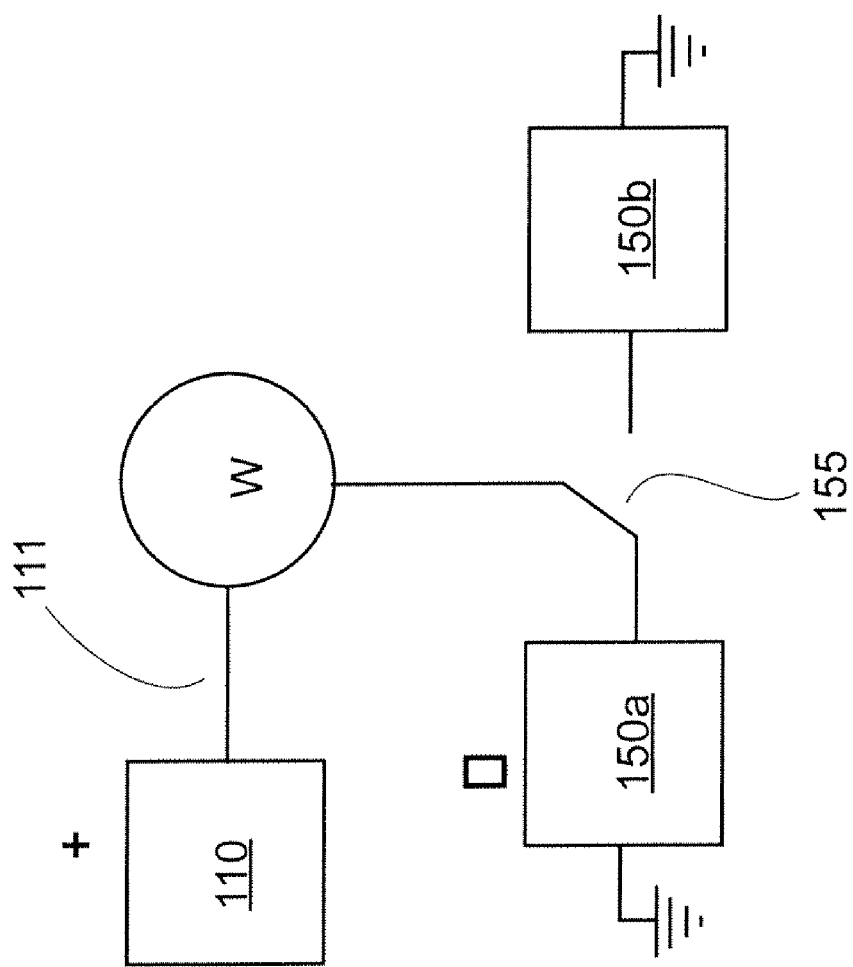
FIG. 4 is an electrical circuit diagram of the plating apparatus in contact with a wafer, in accordance with the present invention.

FIG. 4 provides an electrical circuit diagram of a plating apparatus, in accordance with one embodiment of the present invention. The plating head 110, positively charged as an anode, is electrically connected to the wafer W by way of the plating meniscus 111. The conductivity of the plating meniscus 111 is enabled by an electrolyte and conductive materials contained in the fluid. The plating meniscus 111 formed between the plating head 110 and the wafer W provides an electrical path for electrons to travel on the surface of the wafer W between the electrical contact at the back edge of the wafer 150a when a switch 155 is engaged in the direction of and in contact with the electrical contact at the trailing edge of the wafer 150a. The electrical contacts 150a and 150b are negatively charged or grounded, completing the electrical circuit from plating head 110, the anode, to the wafer W, the cathode. While simply illustrated, the switch 155 is capable of engaging the contacts 150a, 150b, or both 150a and 150b. The switch 155 is capable of incrementally shifting electrical contact from 150a to 150b during the plating operation as the plating head 110 proceeds in a relative direction 160 across the surface of the wafer W. In another embodiment, the contacts 150a and 150b are capable of independent physical movement (as discussed in FIG. 1 above) in order to provide electrical contact to or separation from the wafer W.

Figure 5:
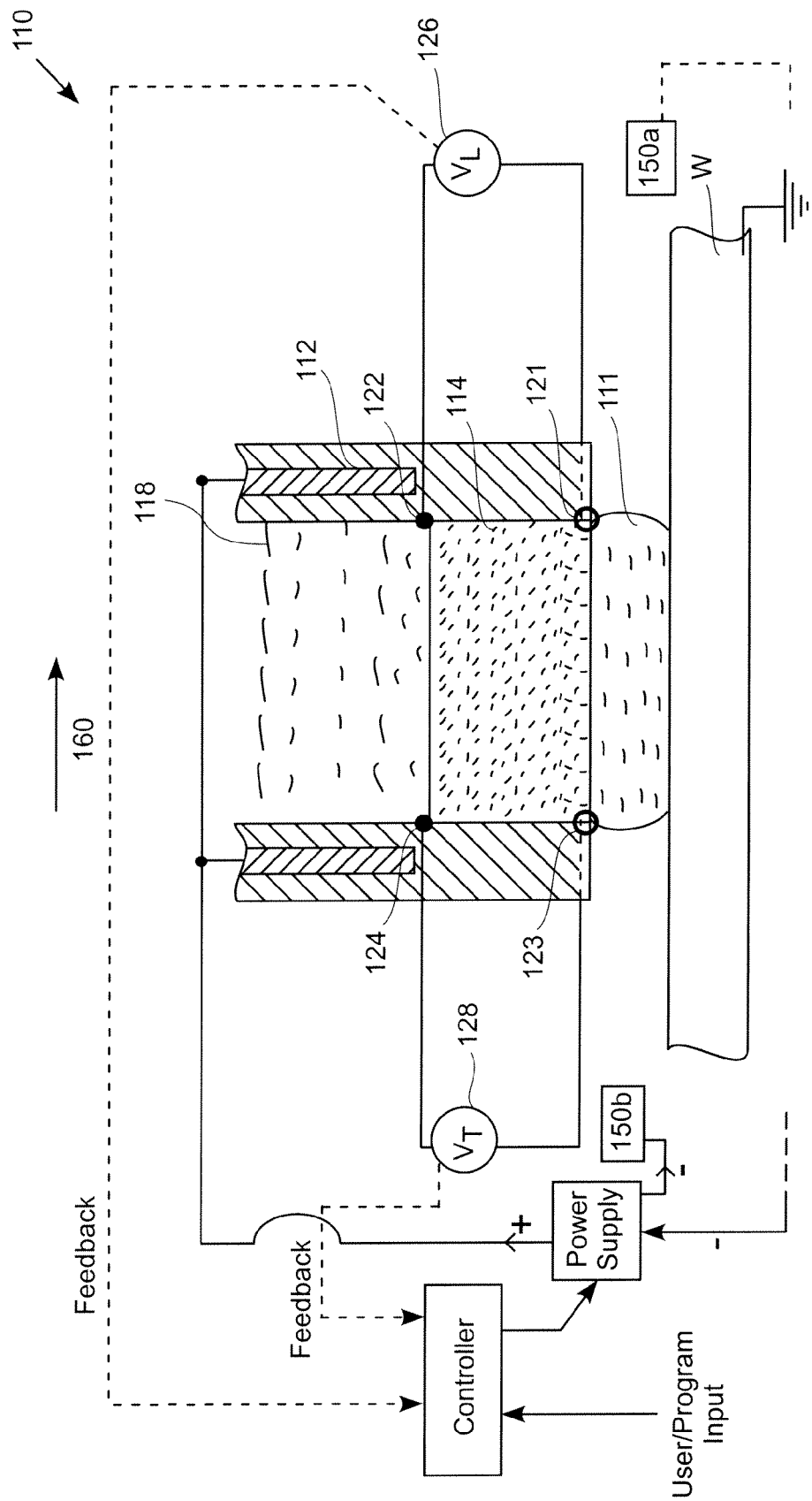
FIG. 5 provides a detailed side view of the plating head over a wafer, in accordance with the present invention.

FIG. 5 provides a detailed illustration of the electroplating apparatus focusing on the plating head 110. A plating chemistry 118 is provided in a reservoir within the plating head 110. The plating chemistry 118 may be designed for plating of copper, however other plating chemistries may be substituted depending on the particular application (i.e., the type of metallic material needed). The plating chemistry 118 could be defined by an aqueous solution for depositing metals, alloys, or composite metallic materials. In one embodiment, plated metals can include, but not limited to, one of a copper material, a nickel material, a thallium material, a tantalum material, a titanium material, a tungsten material, a cobalt material, an alloy material, a composite metallic material, etc. The plating solution 118 provides for a reaction at the surface of the wafer W of the form $Me^{x+1}$ [complex]+$e^-$→$Me^x$ [complex]. In this case, Me can be a metal ion such as Cu, and x is 2. The complexing agent can be ethylene diamine, ammonia ($NH_3$), glucoheptonic acid, or others.

The plating head 110 has an anode 112 on either side of the reservoir containing the plating chemistry 118. Voltage may be applied to the anode 112 by a power supply providing the charge for the electrochemical reaction. Single dry contact between the wafer W and the electrical contact at the trailing edge of the wafer 150a described above provides a current path that is not radially symmetrical in the traditional sense. The plating chemistry 118 contained in the plating meniscus 111 provides an electrolytic solution whereby the reaction at the surface of the wafer W is $Cu^{+2}+2e^-$→$Cu$ when an electrical charge has been applied to the anode 112. As the plating head 110 proceeds in the relative direction 160 towards the electrical contact at the trailing edge of the wafer 150a uniform current distribution is realized in the area undergoing plating operations beneath the plating head 110.

The power supply is electrically connected to the electrical contact at the front edge of the wafer 150b and the electrical contact at the trailing edge of the wafer 150a. The electrical contacts 150a and 150b are capable of independent control and independent contact to the wafer W. A porous applicator 114 sits directly below the plating chemistry 118 providing the base for the reservoir. The porous applicator 114 is composed of a porous ceramic or other suitable material that is capable of allowing the plating chemistry 118 to pass from the reservoir to the area between the plating head 110 and the surface of the wafer W. An example of a suitable porous applicator 114 has been described in co-pending U.S. patent application Ser. No. 10/879,396, filed on Jun. 28, 2004, entitled "Electroplating Head and Method for Operating the Same" and incorporated by reference in its entirety herein. The porous applicator 114 provides for current I flow from the anode 112 to the surface of the wafer W at a substantially normal angle of incidence.

The plating chemistry 118 that passes through the porous applicator 114 is preferably confined in a plating meniscus 111 that is defined as a thin layer of fluid lying over the wafer W beneath the plating head 110. The thickness of the plating meniscus 111 may vary based on the desired application. In one example, the thickness of the meniscus may range between about 0.1 mm and about 10 mm. Thus, the plating head 110 is placed close to the wafer surface. As used herein, the term "close" defines a separation between the undersurface of the plating head 110 and the surface of the wafer W, and that separation should be sufficient to enable the formation of a fluid meniscus. The porous applicator 114 acts as a resistive plate at the plating meniscus 111 close to the surface of the wafer W. Cat ions are introduced through a membrane between the reservoir and the porous applicator 114.

In accordance with the invention, the plated material is formed by a chemical reaction taking place in the plating meniscus 111 containing the plating chemistry 118. Charging the anode 112 within the plating head 110 facilitates the chemical reaction on the surface of the wafer W. To enable the plating, a reduction of ions in the chemistry is performed at the wafer W, which is charged as a cathode through the electrical contact 150a to the power supply. The chemical reaction causes a plated layer 103 layer to be formed. Reaction byproducts and depleted reactant fluids are removed by the proximity head 130 (discussed above).

Still referring to FIG. 5, a voltage sensor pair 126 on the leading side of the plating head 110 when the plating head 110 moves in the relative direction 160 over the surface of the wafer W, provides voltage monitoring data between the voltage sensors 121 and 122 to a controller. Similarly on the trailing edge of the plating head 110, a second voltage sensor pair 128 provides voltage monitoring data between the voltage sensors 123 and 124 on the trailing edge of the plating head 110 to the controller. The controller receives feedback from the voltage sensor pairs 126 and 128 and is capable of regulating the power provided by the power supply to the anode 112 and the electrical contacts 150a and 150b. The voltage sensor pairs 126 and 128 provide data to the controller which is capable of providing current density control.

Figure 6A:
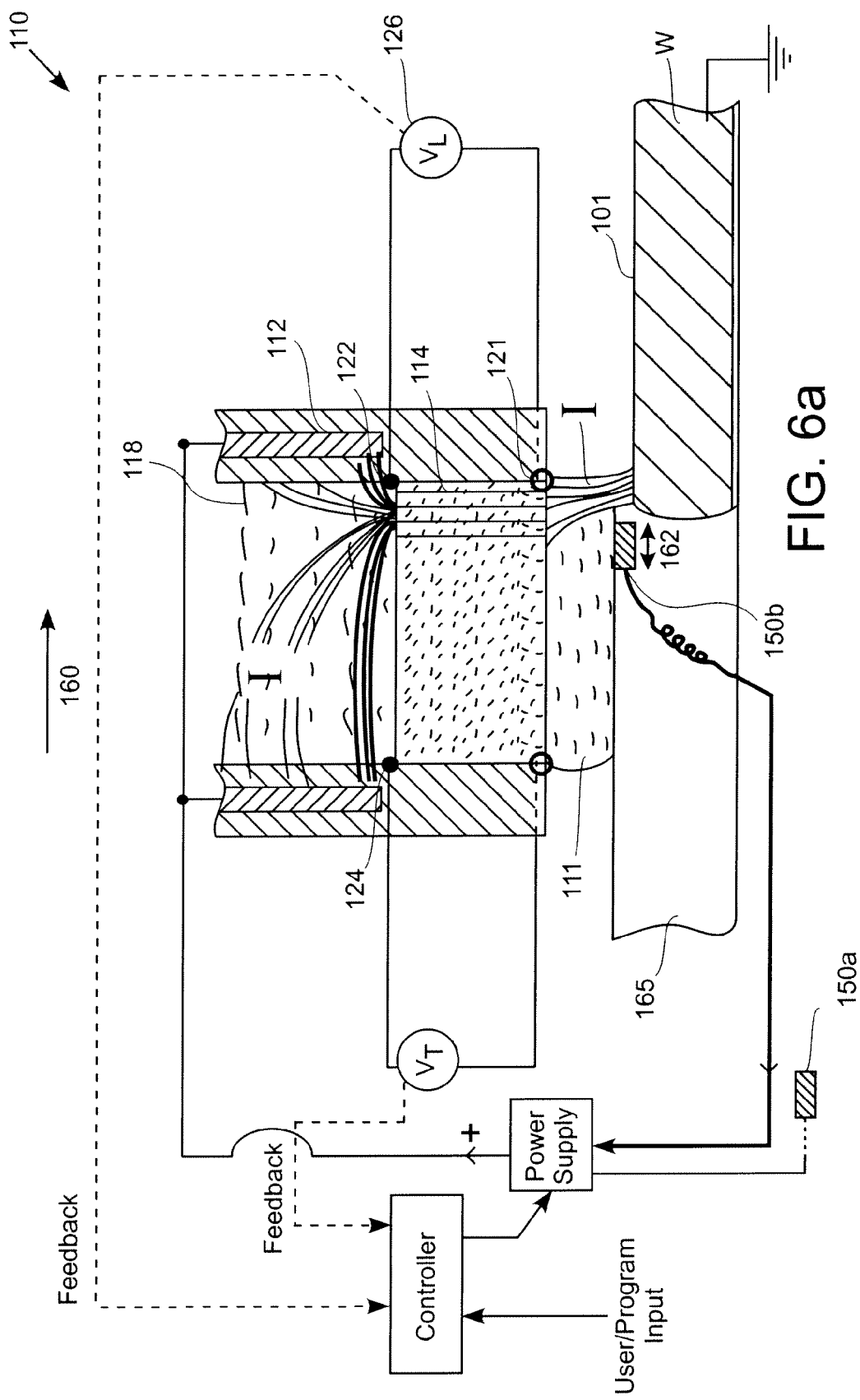
FIG. 6a provides a detailed side view of the plating head in operation as it transitions over an edge of a wafer, in accordance with the present invention.

As shown in FIG. 6a, feedback mechanisms allow for monitoring and control of power applied to the plating head 110, in accordance with the present invention. During a transition of the plating head 110 over the edge of the wafer W, feedback from the voltage sensor pairs 126 and 128 allow for monitoring and the subsequent control of power distributed by the power supply to the plating head 110. The controller receiving data from voltage pairs 126 and 138 will note the presence of the wafer W as it begins to pass beneath the voltage sensor 126. In one embodiment, the wafer W rests on the support 165 with the electrical contact at the front edge of the wafer 150b removed in the direction 162 from physical contact with the wafer W. Negative charge is then applied at the electrical contact at the trailing edge of the wafer 150a (see FIGS. 1-5) in a dry edge exclusion region of the wafer W. As the plating head 110 moves in a relative direction 160 over the edge of the wafer W the plating operation is effectively controlled despite the evolving plating area, increasing the current I to maintain constant voltage as the resistivity of the surface area subtended by the plating head 110 decreases. Current density in the area beneath the plating head 110 effectively remains constant. The controller is also capable of recognizing that the plating head 110 is positioned only partially over the wafer W.

FIG. 6b provides a top view of the electroplating apparatus as the plating head 110 transitions over the front edge of the wafer W, in accordance with the present invention. As shown, the electrical contact at the front edge of the wafer 150b is not touching the wafer W. Voltage sensors pair 128 on the trailing edge of the plating head 110 has not transitioned over the wafer W. The plating meniscus 111 is present over a portion of the wafer W thus providing for introduction of current I across the surface of the wafer W through the electrical contact at the trailing edge of the wafer 150a. The voltage sensor pair 126 is above a region of the wafer W undergoing the electroplating operation. The controller (see FIGS. 5 and 6a) is capable of regulating the amount of current I applied to the region of the wafer W subtended by the plating head 110.

FIG. 6c provides a graphical representation of the amount of current applied across the surface of the wafer W undergoing plating operations in accordance with the present invention. The relationship between the surface area of the wafer and the current applied while voltage is held constant is governed by V=IR. On the graph, the x axis represents the distance from the leading edge to the trailing edge of the wafer W and can also represent the amount of time taken for the plating head 110 to transverse the surface of the wafer W. The area under the curve Xe represents an amount of current applied at the leading edge of the wafer. The area under the curve Xc represents an amount of current applied at the center of the wafer, a time when the largest surface area of the wafer is subtended by the plating head 110. Data from the voltage sensor pairs 126 and 128 received by the controller could provide a graphical representation such as that shown in FIG. 6c. As the plating head 110 transverses the wafer W the plating operation is effectively controlled despite the evolving plating area. The controller capable of receiving data from the voltage sensor pairs 126 and 128 ensures that electrical current applied at the surface of the wafer is proportionate in magnitude to the surface area of the wafer W subtended by the plating head 110 and the meniscus 111. The current is increased to maintain constant voltage as the resistivity of the surface area subtended by the plating head decreases towards the center of the wafer W and increases from the center towards the trailing edge.

The use of electrical contacts 150a and 150b is shifted as the plating head 110 crosses the center of the wafer W. In order to maintain uniform current density the electrical contact which is the greatest distance from the plating head 110 is used to complete the circuit. When the contact utilized is furthest linearly from the plating head 110 the current field lines are most uniform (perpendicular plating head 110 advancing the relative direction 160). Current density in the area beneath the plating head 110 effectively remains constant by the switching of contact from the electrical contact at the trailing edge of the wafer 150a to the electrical contact at the front edge of the wafer 150b.

Figure 7:
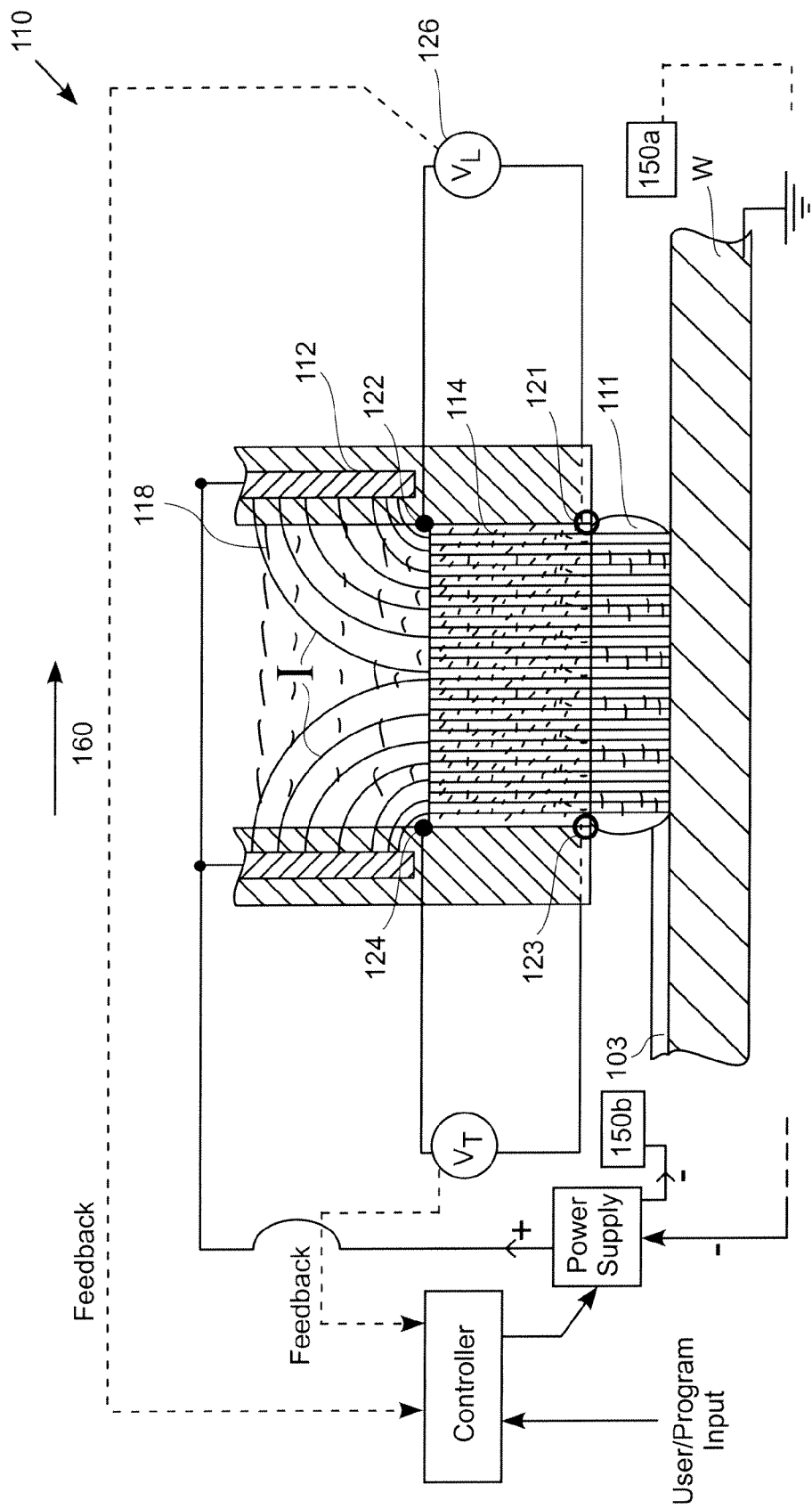
FIG. 7 provides a side view of the plating head in operation as it transitions over a wafer, in accordance with the present invention.

FIG. 7 is a side view of the plating head 110 in operation over the center of the wafer W. As the plating head 110 continues to move in a relative direction 160 toward the trailing edge of the wafer W it leaves in its path a plated layer 103. Current I is directed from the anode 112 through the plating chemistry 118, through the porous applicator 114 and into the plating meniscus 111 that is in contact with the surface of the wafer W. Electrolytic properties of the plating meniscus ensure uniform current distribution below the plating head 110. The current path over the center of the wafer W is uniform through the porous applicator 114 and the plating meniscus 111.

After the plating head 110 has traversed a portion of the wafer W, a proximity head 130 (discussed in FIGS. 2-3 above) cleans and dries the region. When the plating head 110 has progressed to a region near the center of the wafer the dry plated region 105 (shown in FIGS. 2 and 3 as dry plated region 105) can be contacted by the electrical contact at the leading edge of the wafer 150b. As the electrical contact at the leading edge of the wafer 150b makes contact with the wafer, the electrical contact at the trailing edge of the wafer 150a is removed maintaining a single dry contact that provides uniform current distribution at the surface of the wafer W, the cathode.

During the transition from the electrical contact at the trailing edge of the wafer 150a to the electrical contact at the leading edge of the wafer 150b charge applied to 150a and 150b must be carefully controlled. Physical contact of the electrical contact at the leading edge of the wafer 150b is made prior to the application of current to 150b by the power supply. As the plating head 110 crosses the wafer center the current I is transitioned from 150a to 150b maintaining total and constant current density while reducing the trailing edge 150a current to zero and simultaneously increasing the leading edge 150b current to the desired level in order to maintain constant voltage across the voltage sensor pairs 126 and 128. In accordance with the present invention, bipolar effects that traditionally cause etching of the plated material directly under the contacts, are avoided by the use of single-point dry electrical contact with the surface of the wafer. Plating contact hardware is therefore simplified in the present invention significantly improving process control and reliability.

FIG. 8 provides a top view of an electroplating apparatus. A plurality of wafer W may be transported beneath the plating head 110 on a support 165 in a relative direction 160. A proximity head 130 may be in line for subsequent cleaning of the wafer W after the initial plating performed by plating head 110. A series of plating heads 110 and proximity heads 130 may be positioned along the transport mechanism in a fashion similar to conveyor belt type processing. Other suitable wafer transport and handling mechanisms may be used to aid in the efficiency of the plating process.

FIG. 9 is another embodiment of an electroplating apparatus. In this embodiment the plating head 110 and the proximity head 130 are attached to a spindle 220 capable of being positioned over the surface of the wafer W. The wafer W is placed on a support 165 and is capable of being charged as a cathode by electrical contacts 150a and 150b. The spindle 220 supports the plating head 110 and the proximity head 130 and is capable of moving in the relative direction 160 or in the reverse direction in order to be placed in positions above the wafer W. The spindle 220 can scan across the surface of the wafer W during plating operations. The spindle 220 is capable of repositioning the plating head 110 and the proximity head 130 180 degrees so that the proximity head 130 follows the plating head 110 should the plating head be scanning the wafer W in the direction opposite relative direction 160. The plating meniscus 111 is shown between the plating head 110 and the wafer W, while the cleaning meniscus 131 located between the proximity head 130 and the wafer W is shown following the plating head 110.

Figure 10A:
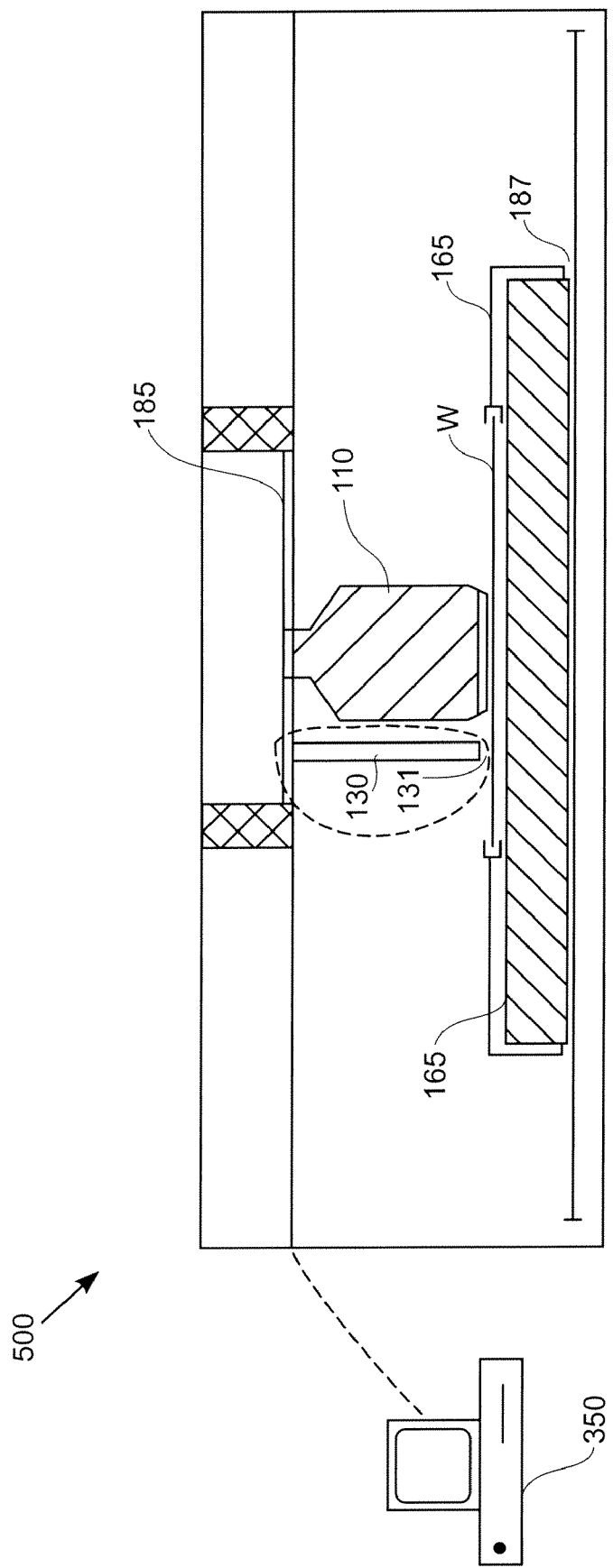
FIG. 10a illustrates an electroplating system in operation, in accordance with another embodiment of the present invention.

FIG. 10a is a diagram of an electroplating system 500 in accordance with one embodiment of the present invention. The plating head 110 is supported by a head transport 185 above a wafer W placed on a support 165. A wafer transport 187 is capable of moving the wafer W beneath the plating head 110. A computer 350, also known as a controller, is capable of orchestrating the operation of the electroplating system 500 including the relative movement of the wafer W with regard to the plating head 110. In another embodiment the head transport 185 can be outfitted with a proximity head 130 which is capable of following in the path of the plating head 110 cleaning the wafer W. In yet another embodiment, the head transport 185 may support a spindle 220 like that discussed in FIG. 9 above that is configured to support both a plating head 110 and a proximity head 130.

In another embodiment, eddy current sensors 230 are integrated into the electroplating system 500 as shown in FIG. 10b. The eddy current sensors 230 can be placed in the proximity head 130 (in FIGS. 2, 8, 9, 10a, 10b) or the spindle 220 (FIG. 9) with complimentary sensors placed in the support 165 beneath the wafer W. The eddy current sensors 230 are in communication with the computer 350. The eddy current sensors 230 are used to determine the presence and thickness of a metallic layer and to determine when a particular process is complete (e.g., end pointing) or any combination thereof. In one embodiment, the thickness of the plated layer 103 can be sensed during the plating process. In this manner, controlled application of metallic materials can be attained from the eddy current sensors 230 that are in communication with the computer 350. While simply drawn, the placement of the eddy current sensors 230 is only exemplary and suitable arrangement of the eddy current sensors 230 may depend on the application. Of course, other techniques for measuring the thickness of the plated layer 103 and dry plated region 105 can be used. For a more detailed description of the functionality of the eddy current sensor 230, reference can be made to U.S. patent application Ser. No. 10/186,472, entitled "Integration of Sensor Based Metrology into Semiconductor Processing Tools", filed on Jun. 28, 2002, and which is incorporated herein by reference.

Figure 11:
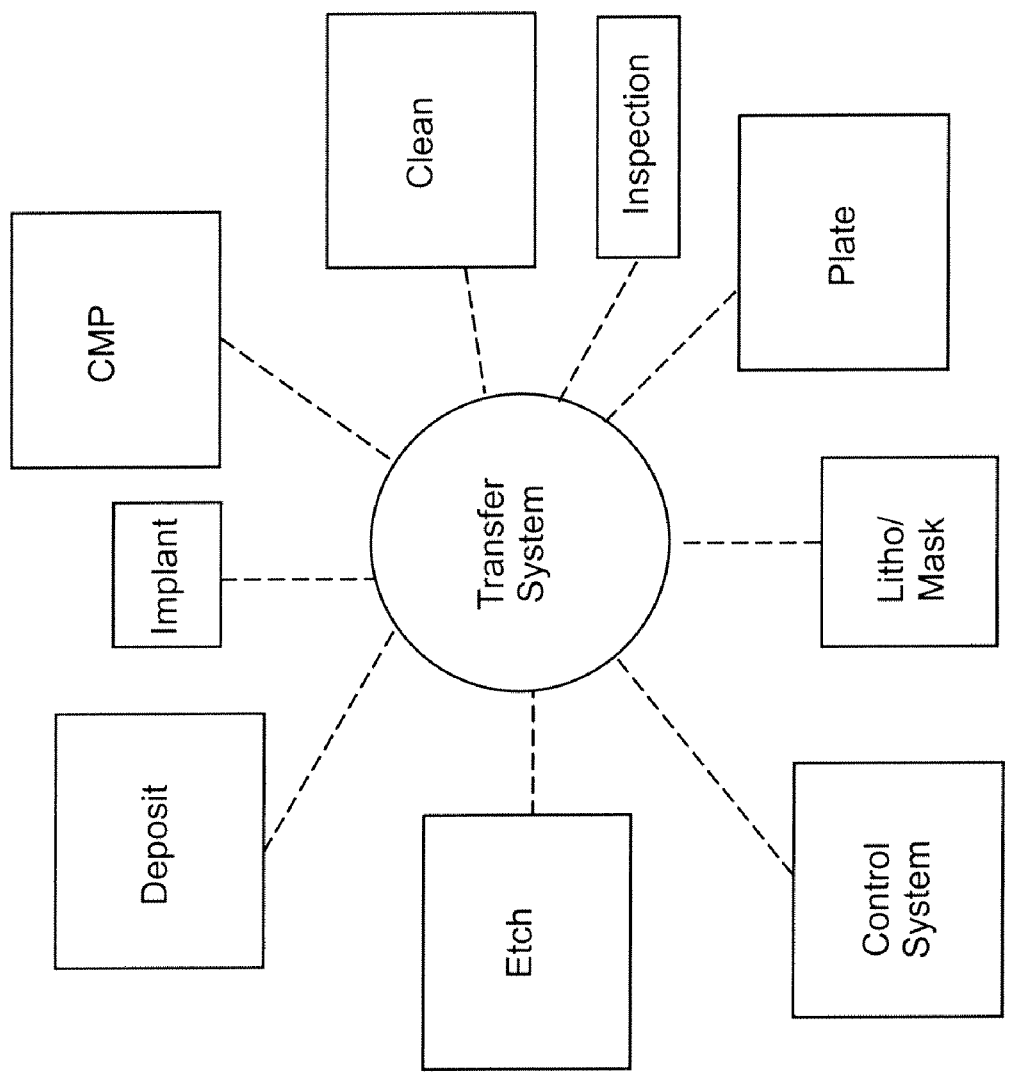
FIG. 11 illustrates the integration of the plating system into a larger processing apparatus capable of various stages of processing, in accordance with another embodiment of the present invention.

FIG. 11 illustrates the integration of the plating system into a larger processing apparatus capable of several stages of wafer processing. The electroplating apparatus described in FIGS. 1-10 above can be integrated into a wafer transfer and control system capable of processing wafers in an etch system, a cleaning system, a chemical mechanical planarization system, a deposition system, implantation system, a lithography system, a masking system, and an inspection system. The integration of such processing tools may include physically arrangement in a cluster or other suitable configuration that provides multi-tool functionality in a space efficient manner (limiting the footprint of the processing tools). The integration of such processes may depend on the needs of semiconductor manufacturers and the compatibility of various equipment components. Industry standards established by Semiconductor Equipment and Materials International (SEMI) such as the Modular Equipment Subcommittee for Communications (MESC) and the Generic Equipment Model (GEM) assist in the integration of wafer processing equipment.

Figure 12:
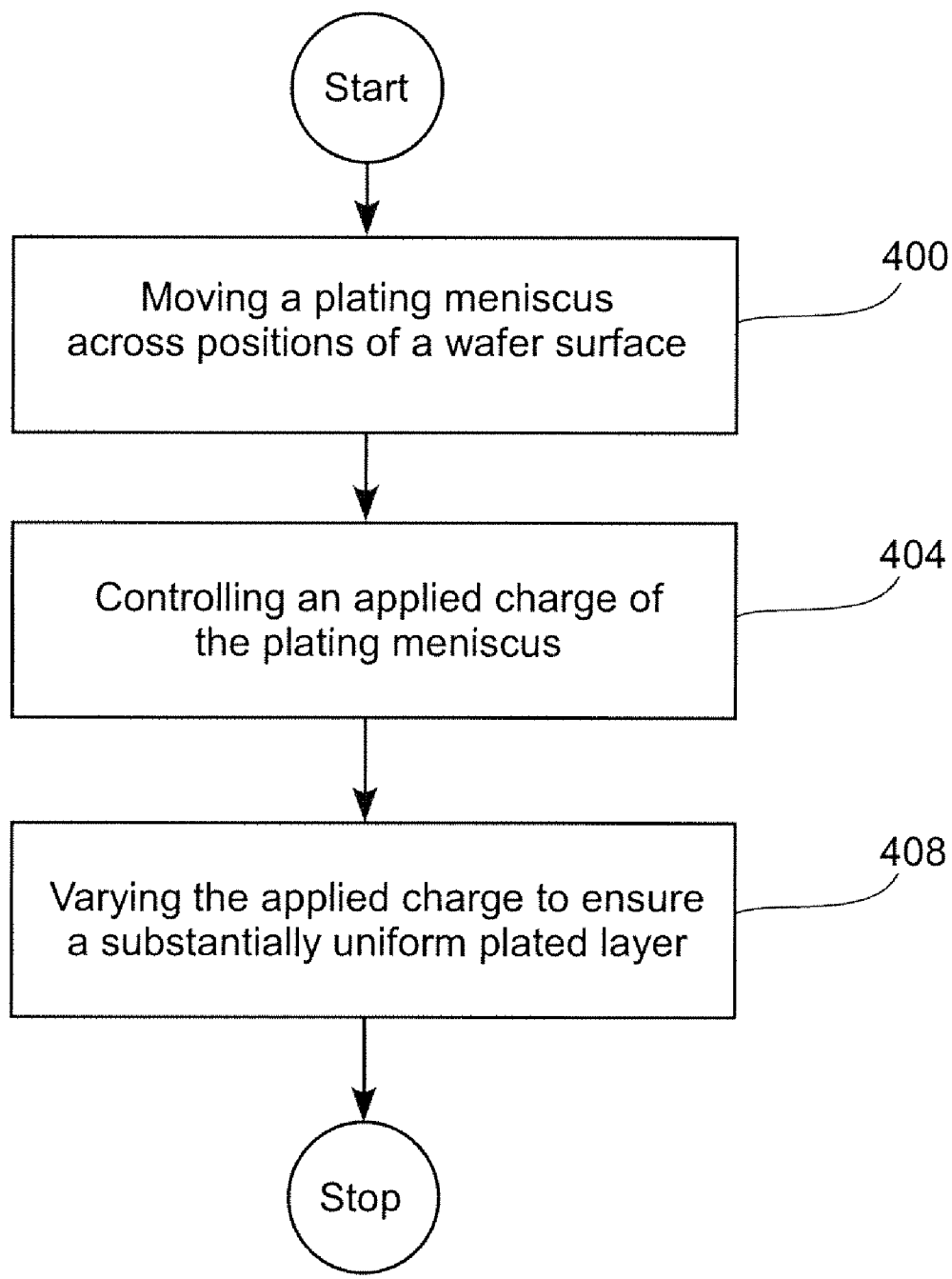
FIG. 12 is a flow chart diagram that provides an exemplary method of electroplating, in accordance with the present invention.

FIG. 12 is a flow chart diagram that provides a method of electroplating in accordance with the present invention. Providing an electroplating apparatus as described in FIGS. 1-11 above, the method begins when a plating meniscus is moved across positions of a wafer surface in operation 400. The plating meniscus is formed between a plating head and the surface of a wafer. The plating meniscus contains a plating chemistry and electrolyte as described in the figures above. Next, in operation 404, an electrical charge is controllably applied to the plating meniscus. The applied charge is provided to the plating meniscus by the plating head that is electrically charged as an anode by a power supply. The applied charge constitutes both a voltage and current component and may be controlled by substantially regulating the voltage or the current during the electroplating process. In operation 408, the applied charge to the plating meniscus is varied to ensure a substantially uniform plated layer. Regulation of the applied charge ensures that uniform current density is applied across the wafer surface.

Figure 13:
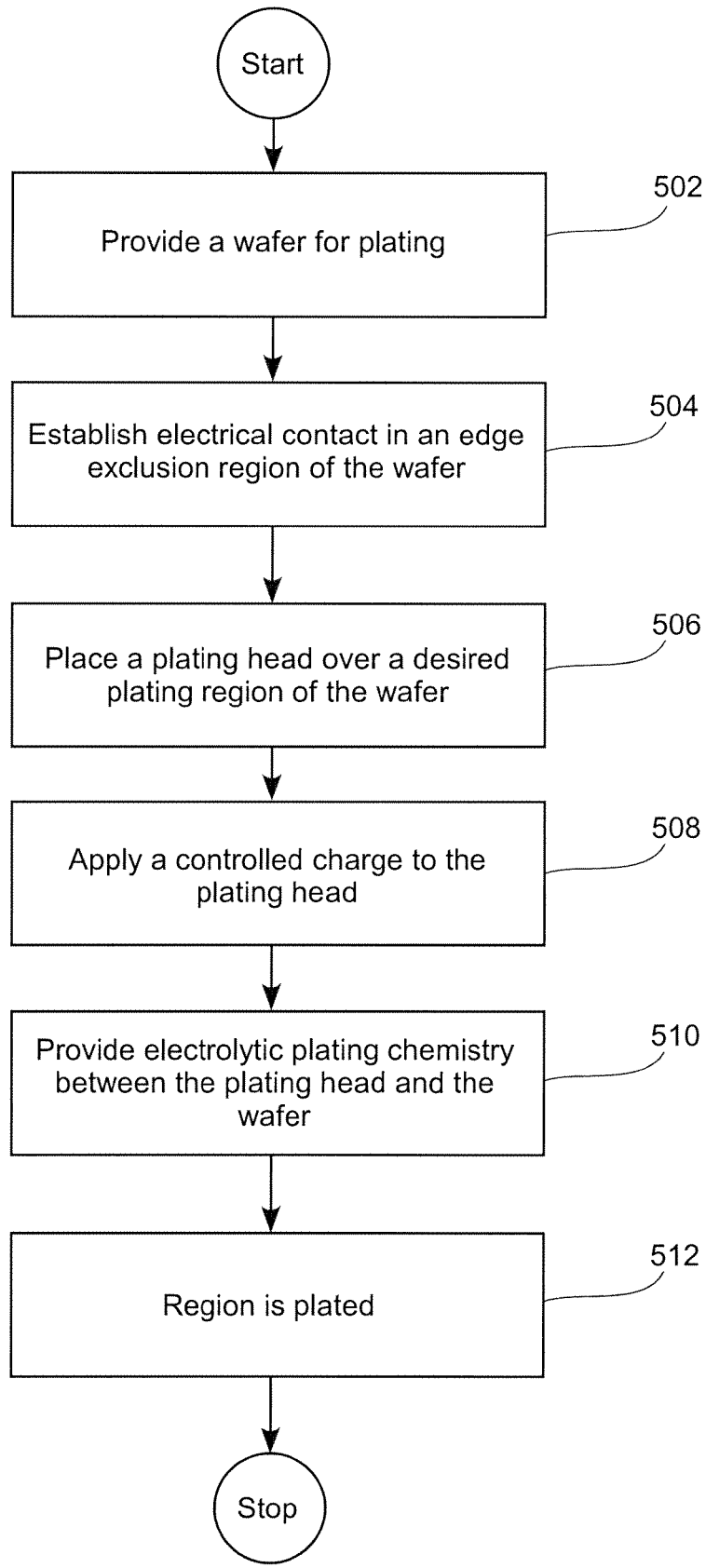
FIG. 13 provides a flow chart of a method of operation for an electroplating system, in accordance with one embodiment of the present invention.

FIG. 13 is a flow chart diagram that provides a method of operation for an electroplating system in accordance with the present invention. Given the electroplating apparatus as described in FIGS. 1-11 above, an operator or transport system must provide a wafer with a seed layer 502. In an alternative embodiment, the wafer may not have a seed layer yet formed thereon. The wafer may be transported to the wafer support of the electroplating apparatus in a number of ways. Wafer transport may include a series of manual or automated robotic movements assisted by mechanical, vacuum, electrostatic or other ways of holding the wafer. The wafer is then provided an electrical contact in an edge exclusion region 504. Next a plating head is placed over the desired plating region of the wafer in operation 506. Placement of the plating head may be predefined and facilitated by an automated routine. The plating head may be scanned across the surface of the wafer.

In operation 508 a power supply applies a charge to the plating head responsible for plating. The charge may be applied at any time prior to plating including during the wafer and arm movements. A porous applicator provides an electrolytic plating chemistry between the plating head and the surface of the wafer in operation 510. The charge applied by the anode in the plating head is transferred through the electrolytic plating chemistry to the wafer completing the circuit and the material is plated in operation 512. The porous applicator provides for current I flow to the surface of the wafer W at a substantially normal angle of incidence. The applied charge is regulated to ensure that a constant current density is applied across all regions of the wafer being plated deepening on the plating position.

Operations 508 and 510 may be interchanged without affecting the electroplating process. The electrical circuit enabling the plating is not complete until the electrolytic chemistry is in contact with the surface of the wafer. The electrolytic plating chemistry determines the material to be plated by the electrochemical reaction. Different materials may be plated depending on the plating chemistry used, in an exemplary embodiment a copper plating chemistry may be used to plate a copper layer on a wafer.

While this invention has been described in terms of several preferred embodiments, it will be appreciated that those skilled in the art upon reading the preceding specifications and studying the drawings will realize various alterations, additions, permutations and equivalents thereof. For instance, the electroplating system described herein may be utilized on any shape and size of substrates such as for example, 200 mm wafers, 300 mm wafers, flat panels, etc. It is therefore intended that the present invention includes all such alterations, additions, permutations, and equivalents as fall within the true spirit and scope of the claimed invention.

What is claimed is:

1. An electroplating apparatus for electroplating a surface of a wafer, the surface of the wafer capable of being electrically charged as a cathode, comprising:
    a plating head capable of being positioned either over or under the surface of a wafer and capable of being electrically charged as an anode, the plating head capable of enabling metallic plating between the surface of the wafer and the plating head when the wafer and plating head are charged, the plating head further including,
    a reservoir for holding an electrolytic solution and a plating chemistry;
    a porous applicator coupled to the reservoir at a location that is proximate to the surface of the wafer, the porous applicator defined to deliver the electrolytic solution and the plating chemistry for metallic plating the surface of the wafer;
    a first voltage sensor pair defined between the porous applicator at a first side of the plating head, the first voltage sensor defined to sense a voltage between the plating head and the surface of the wafer;
    a second voltage sensor pair defined between the porous applicator at a second side of the plating head, the second voltage sensor pair defined to sense the voltage between the plating head and the surface of the wafer;
    a pair of electrical contacts charged as a cathode defined to make contact with the surface of the wafer when the plating head is active, the electrical contacts being movable, and wherein one of the electrical contacts is defined to be placed apart from the surface of wafer when plating near the one of the pair of electrical contacts; and
    a controller processing data from the first and second voltage sensor pairs, the data being used by the controller to maintain a substantially constant voltage between the surface of the wafer and the plating head, and wherein the controller changes a voltage applied by the anode in response to sensing voltage changes from either the first voltage sensor pair or the second voltage sensor pair.

2. An electroplating apparatus for electroplating a surface of a wafer as recited in claim 1, wherein the data obtained from the voltage sensor pair is used to determine when the plating head is positioned at least partially over the wafer.

3. An electroplating apparatus for electroplating a surface of a wafer as recited in claim 1, wherein a meniscus is defined between the plating head and the surface of the wafer facilitates the metallic plating on the area subtended by the plating head.

4. An electroplating apparatus for electroplating a surface of a wafer as recited in claim 3, wherein the meniscus is maintained by a surface tension gradient of a fluid containing one of the plating chemistry and the electrolyte between the plating head and the surface of the wafer.

5. An electroplating apparatus for electroplating a surface of a wafer as recited in claim 1, wherein the controller defined to receive data from the voltage sensor pair ensures that an electrical current applied at the surface of the wafer is proportionate in magnitude to a surface area of the wafer subtended by the plating head and a meniscus.

6. An electroplating apparatus for electroplating a surface of a wafer as recited in claim 1, wherein the data collected by the controller is analyzed in order to provide an amount of current to be applied by the anode when the plating head is placed in positions over the surface of the wafer.

7. An electroplating apparatus for electroplating a surface of a wafer as recited in claim 1, wherein the electroplating apparatus further comprises:
    a proximity head capable cleaning and drying of the surface of the wafer, the proximity head including,
    a plurality of inputs capable of providing one or more of de-ionized water, chemicals, diluted chemicals, and isopropyl alcohol; and
    a plurality of outputs capable of removing fluids provided by the inputs or fluids and residues present on the surface of the wafer.

8. An electroplating apparatus for electroplating a surface of a wafer as recited in claim 1, wherein each electrical contact is made to an edge exclusion region of the wafer.

9. An electroplating apparatus for electroplating a surface of a wafer as recited in claim 1, wherein the plating chemistry is defined by an aqueous solution for plating metals including a copper material, a nickel material, a thallium material, a tantalum material, a titanium material, a tungsten material, a cobalt material, an alloy material, or a composite metallic material.

10. An electroplating apparatus for electroplating a surface of a wafer as recited in claim 1, wherein the electroplating apparatus is part of a cluster of equipment capable of processing wafers.

11. An electroplating apparatus for electroplating a surface of a wafer as recited in claim 10, wherein the equipment capable of processing wafers includes one or more of an etch system, a cleaning system, a drying system, a chemical mechanical planarization system, a deposition system, implantation system, a lithography system, a masking system, an inspection system, and one or more wafer transport and control mechanisms.

12. An electroplating apparatus for electroplating a surface of a wafer, the surface of the wafer defined to be electrically charged as a cathode when present in the electroplating apparatus, comprising:
    a plating head having an anode, the plating head defined to facilitate metallic plating between the surface of the wafer and the plating head, the plating head including,
    (i) a reservoir for holding an electrolytic solution and a plating chemistry;
    (ii) a porous applicator interfaced with the reservoir, the porous applicator having a thickness, such that a first side of the porous applicator is in contact with the reservoir and a second side of the porous applicator defines a plating head surface;

(iii) a first voltage sensor pair defined between the first side of the porous applicator and the second side of the porous applicator, the first voltage sensor pair being defined at a first side of the plating head, the first voltage sensor defined to sense a voltage between the plating head and the surface of the wafer; and (iv) a second voltage sensor pair defined between the first side of the porous applicator and the second side of the porous applicator, the second voltage sensor pair defined at a second side of the plating head, the second voltage sensor defined to sense the voltage between the plating head and the surface of the wafer;

a controller for adjusting a voltage applied to the anode based on a magnitude of voltage detected at either the first or second voltage sensor pairs; and a pair of electrical contacts charged as a cathode defined to make contact with the surface of the wafer, the electrical contacts being movable, wherein one of the electrical contacts is defined to be in non-contact orientation with the surface of wafer when plating near the one of the pair of electrical contacts.

13. An electroplating apparatus for electroplating a surface of a wafer as recited in claim 12, wherein the controller is defined to process data from the first and second voltage sensor pairs, the data being used by the controller to maintain a substantially constant voltage between the surface of the wafer and the plating head, and wherein the controller changes a voltage applied by the anode in response to sensing voltage changes from either the first voltage sensor pair or the second voltage sensor pair.

14. An electroplating apparatus for electroplating a surface of a wafer as recited in claim 12, further comprising, a wafer handling mechanism for transferring and holding the wafer in position during processing; and a computer capable of controlling the operation of the electroplating system.

* * * * *